(12) United States Patent
Noh et al.

(10) Patent No.: US 7,667,392 B2
(45) Date of Patent: Feb. 23, 2010

(54) ORGANIC LIGHT EMITTING DIODE AND METHOD OF FABRICATING THE SAME

(75) Inventors: Sok Won Noh, Seoul (KR); Mu Hyun Kim, Yongin-si (KR); Jin Wook Seong, Seoul (KR); Sun Hoe Kim, Jeongeup-si (KR); Myung Won Song, Yongin-si (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 451 days.

(21) Appl. No.: 11/526,664

(22) Filed: Sep. 26, 2006

(65) Prior Publication Data

US 2007/0069639 A1 Mar. 29, 2007

(30) Foreign Application Priority Data

Sep. 28, 2005 (KR) ...................... 10-2005-0090738

(51) Int. Cl.
*H01J 1/62* (2006.01)
(52) U.S. Cl. ........................................ 313/506; 313/504
(58) Field of Classification Search ................. 313/498, 313/504, 506, 509, 512
See application file for complete search history.

(56) References Cited

U.S. PATENT DOCUMENTS

| 5,998,085 | A | 12/1999 | Isberg et al. |
|---|---|---|---|
| 6,768,257 | B1 | 7/2004 | Yamada et al. |
| 7,300,686 | B2* | 11/2007 | Morii et al. ............... 427/421.1 |
| 2004/0135501 | A1 | 7/2004 | Nishikawa |
| 2004/0178725 | A1 | 9/2004 | Karawawa et al. |
| 2005/0116631 | A1 | 6/2005 | Kim et al. |
| 2005/0136344 | A1 | 6/2005 | Kang et al. |
| 2006/0022587 | A1 | 2/2006 | Jeong et al. |

FOREIGN PATENT DOCUMENTS

| CN | 1 622 708 A | 6/2005 |
|---|---|---|
| JP | 2001-195008 A | 7/2001 |
| JP | 2004-031262 A | 1/2004 |
| JP | 2004-165067 A | 6/2004 |
| JP | 2005-158494 A | 6/2005 |
| JP | 2005-183381 A | 7/2005 |
| KR | 10-2005-0079097 | 8/2005 |
| KR | 10-2006-0000745 | 1/2006 |
| WO | WO 2005/051049 A1 | 6/2005 |

* cited by examiner

*Primary Examiner*—Vip Patel
(74) *Attorney, Agent, or Firm*—Lee & Morse, P.C.

(57) ABSTRACT

An organic light emitting diode, and a method of fabricating the same, the organic light emitting diode including a pixel-defining layer disposed on a substrate, the pixel-defining layer having an opening therein and having at least one stepped portion formed adjacent to the opening, and an organic layer disposed in the opening and at least partially covering the at least one stepped portion.

20 Claims, 5 Drawing Sheets

ORGANIC LIGHT EMITTING DIODE AND METHOD OF FABRICATING THE SAME

BACKGROUND OF THE INVENTION

1. Field of the Invention

The present invention relates to an organic light emitting diode and a method of fabricating the same. More particularly, the present invention relates to an organic light emitting diode, and a method of fabricating the same, that is configured to reduce or eliminate gases entrapped between an organic layer and an underlying layer when the organic layer is formed.

2. Discussion of Related Art organic light emitting diode may include organic layers as part of the device structure. For example, in forming an organic light emitting diode such as an organic light emitting diode, a lower electrode, e.g., an anode electrode, and/or a pixel-defining layer may have a thin organic layer formed thereon. The organic layer may be, e.g., a hole injection layer, a hole transport layer, an emission layer, a hole blocking layer, an electron transport layer, an electron injection layer, etc. Additional layers such as an upper electrode, e.g., a cathode electrode, may then be formed on the organic layer.

A variety of methods have been developed to form organic layers in organic light emitting diodes. Such methods include, e.g., deposition and lithographic methods. The deposition method may involve forming an organic layer by vacuum-depositing an organic material using a shadow mask. However, it may be difficult to form a high resolution pattern, e.g., one with a very fine pitch, using such a method, and applying the deposition method to large-area display devices may also be difficult.

Lithographic methods may involve depositing an organic material, followed by patterning the material using a photoresist to form the organic layer. Such lithographic methods may be suitable for forming high-resolution patterns. However, some of the pattern-forming steps of the lithographic method, e.g., etching, developing with a developing solution, etc., may cause the organic layer to deteriorate.

In order to avoid the difficulties associated with the deposition and lithographic methods, an ink jet method may be employed to directly pattern the organic layer. In the ink jet method, a solution containing an organic material is discharged from a head of an ink-jet printer to form the organic layer. The solution may include the organic material dissolved or dispersed in a solvent. The ink jet method has the advantage of being relatively simple. However, it may not produce organic layers of uniform thickness, yields may be low and it may be difficult to apply large-area display devices.

A thermal transfer method has been proposed to form organic layers in organic light emitting diodes and it may offer advantages over the methods described above. The thermal transfer method may form an organic layer using, e.g., laser-induced thermal transfer, wherein the organic material is provided on a donor substrate, the donor substrate is placed in close contact with the device substrate, and a laser is scanned across the donor substrate. Heat energy provided by the laser causes the organic material to transfer to the donor substrate, forming the organic layer.

The thermal transfer method may be applied to form, e.g., an organic-processible hole transfer layer, such as an under-array of an organic light emitting diode, red, green and blue organic layers, etc. Laser-induced thermal transfer may offer various advantages, such as formation of high-resolution patterns, uniformity of film thickness, an ability to laminate multiple layers, extensibility into a large motherglass, etc., which make it suitable for the manufacture of large-scale organic light emitting diodes. Such a laser-induced thermal transfer may be used for fabricating a color filter for a liquid crystal display device, forming a pattern of luminescent materials, etc.

FIG. 1 illustrates a plan view of a stage in a conventional method of fabricating a pixel unit of an organic light emitting diode, and FIG. 2 illustrates a cross-sectional view of a stage in a conventional method of fabricating a pixel unit of an organic light emitting diode, taken along a line A-A' of FIG. 1.

Referring to FIGS. 1 and 2, a thin-film transistor 107 and a first electrode layer 209 may be formed on a substrate 200. The thin-film transistor 107 may include a buffer layer 201 and a semiconductor layer 102 that has an active channel layer 102a and ohmic contact layers 102b. A gate insulating layer 203 and a gate electrode 204 may be formed on the active channel layer 102a and the ohmic contact layers 102b. An interlayer dielectric 205 may cover the gate electrode 204 and the gate insulating layer 203, and may have electrode contacts 106a and 106b penetrating therethrough. A planarization layer 208 may overlie these features, and an electrode layer 209 may be formed on top of the planarization layer 208. The electrode layer 209 may make contact with the electrode contact 106a through a via hole 202. A pixel-defining layer 100 may be formed on the planarizing layer 208 and the electrode layer 209, and may have an opening 114 formed therein to expose part of the electrode layer 209.

An organic layer 101, which may be, e.g., a light emitting region, may be formed in the opening 114 of the pixel-defining layer 100 using, e.g., laser-induced thermal transfer. The organic layer 101 may extend laterally beyond the opening 114, so as to be disposed on the electrode layer 209 and on the pixel-defining layer 100. The pixel-defining layer 100 may extend laterally beyond the organic layer 101 along the circumference of the organic layer 101. Thermal transfer of the organic layer may be achieved by scanning a laser lengthwise along the organic layer 101, i.e., in the downward direction illustrated in FIG. 1.

Referring to FIG. 2, a thermal transfer donor film 216 may include a light-to-heat conversion layer 214 formed on a base substrate 213, and may include an organic material-containing transfer layer disposed on the light-to-heat conversion layer 214. The donor film 216 may further include an interlayer 215 between the light-to-heat conversion layer 214 and the transfer layer.

The donor film 216 may be arranged adjacent to and facing an upper portion of a pixel-defining layer 100. A laser may be-irradiated onto and scanned across the donor film 216, such that the light-to-heat conversion layer 214 converts the laser light into heat. The transfer layer may melt and separate from the donor film 216 so as to form the organic layer 101 on the pixel-defining layer 100.

As the transfer layer is transferred from the donor film 216 to the pixel-defining layer 100, gases may be entrapped. In particular, gases may be trapped between the organic layer 101 and the pixel-defining layer 100 and/or the electrode layer 209.

The gas entrapment may be more significant in the last region of interface between the organic layer 101 and the pixel-defining layer 100 and/or electrode layer 209, i.e., the final region scanned by the laser. For example, referring to FIG. 1, gases may be entrapped near the lower region of the organic layer 101 when the laser is scanned from the upper region toward the lower region. As a result, adhesion between the organic layer 101 and the pixel-defining layer 100 and/or the electrode layer 209 may be unsatisfactory, due to the entrapped gases.

SUMMARY OF THE INVENTION

The present invention is therefore directed to an organic light emitting diode and a method of fabricating the same, which substantially overcome one or more of the problems due to the limitations and disadvantages of the related art.

It is therefore a feature of an embodiment of the present invention to provide an organic light emitting diode that includes a stepped portion configured to reduce or eliminate the entrapment of gasses beneath an applied organic layer.

It is therefore another feature of an embodiment of the present invention to provide a method of fabricating an organic light emitting diode including transfer of an organic layer onto a substrate, wherein the substrate includes a stepped portion positioned so as to correspond to the last portion of the organic layer transferred.

At least one of the above and other features and advantages of the present invention may be realized by providing an organic light emitting diode including a pixel-defining layer disposed on a substrate, the pixel-defining layer having an opening therein and having at least one stepped portion formed adjacent to the opening, and an organic layer disposed in the opening and at least partially covering the at least one stepped portion.

The at least one stepped portion may directly adjoin the opening and the organic layer may partially, but not completely, cover the at least one stepped portion. The at least one stepped portion may be positioned at a corner of the opening. The at least one stepped portion may span a side of the opening. The at least one stepped portion may be about 1/4 to about 1/3 as thick as the pixel-defining layer. The pixel-defining layer may have a thickness in a range of from about 50 Å to about 10,000 Å. The at least one stepped portion may be about 1/4 to about 1/2 as wide as the pixel region.

The organic light emitting diode may further include at least one protrusion that projects from the at least one stepped portion and extends away from the substrate, wherein the organic layer covers the at least one protrusion. The at least one protrusion may extend to a same height as the pixel-defining layer.

An electrode layer may be disposed on the substrate between the substrate and the pixel-defining layer, the electrode layer may be at least partially exposed through the opening, and the organic layer may at least partially covers the part of the electrode layer that is exposed through the opening. The organic layer may form at least one of an emission layer, a hole injection layer, a hole transport layer, a hole blocking layer, an electron transport layer, and an electron injection layer.

At least one of the above and other features and advantages of the present invention may also be realized by providing a method of fabricating an organic light emitting diode, including forming a pixel-defining layer on a substrate, the pixel-defining layer having an opening and at least one stepped portion, and transferring an organic layer onto the substrate so that the organic layer is disposed in the opening and at least partially covering the at least one stepped portion.

The at least one stepped portion may be positioned relative to the opening so as to correspond to a last portion of the organic layer to be transferred onto the substrate. The transfer of the organic layer may begin at a first side of the opening and end at a second side of the opening opposite the first side. The opening may be oblong, and the first and second sides may be narrow portions of the oblong opening. The transferring may include a laser-induced thermal transfer, and the direction of laser scanning may be such that laser scanning ends near the at least one stepped portion.

At least one of the above and other features and advantages of the present invention may further be realized by providing an organic light emitting diode including a base layer, an intermediate layer on the base layer, the intermediate layer having an opening therein to expose a portion of the base layer, and an organic layer, the organic layer disposed in the opening so as to cover the exposed portion of the base layer and disposed on the intermediate layer, wherein the intermediate layer includes a recessed portion adjacent to the opening, and the organic layer partially covers the recessed portion and partially exposes the recessed portion.

The recessed portion may extend from a first edge of the opening laterally beyond the organic layer. The recessed portion may have a first height where it meets the first edge of the opening, the opening may have a second edge having a second height, and the first height may be less than the second height. The organic layer may have at least three sides and the recessed portion may extend beyond at least two of the sides of the organic layer.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
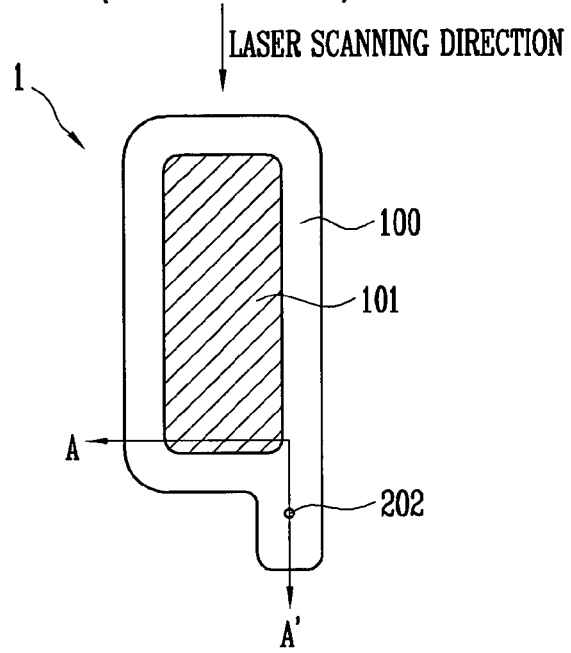
FIG. 1 illustrates a plan view of a stage in a conventional method of fabricating a pixel unit of an organic light emitting diode.
Figure 2:
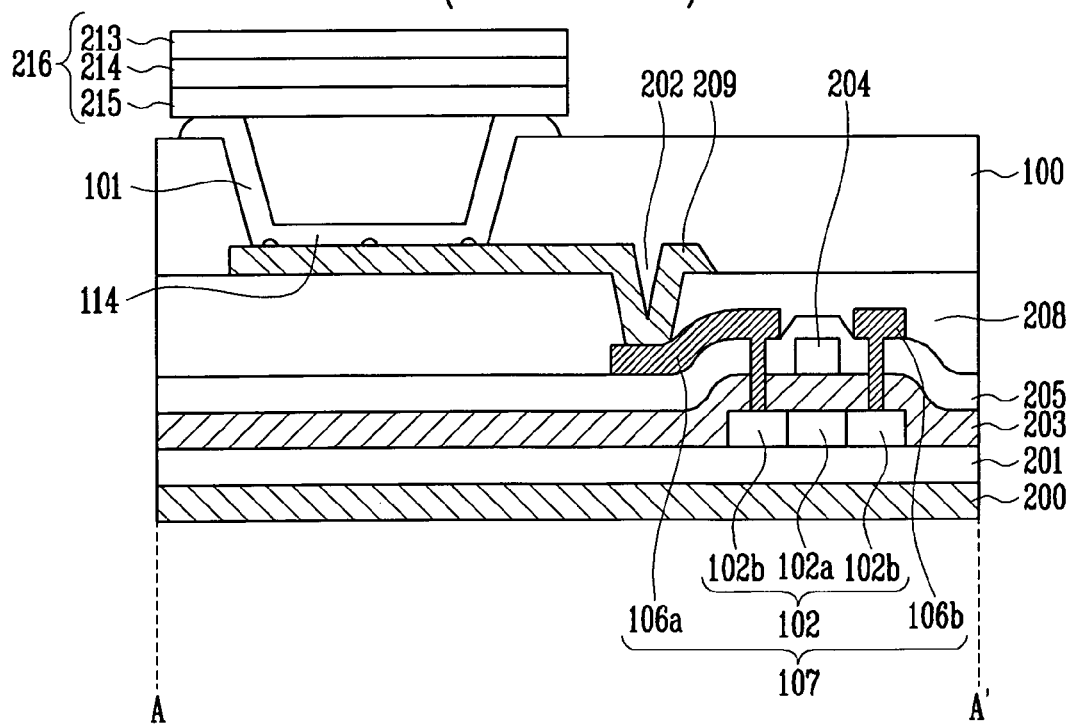
FIG. 2 illustrates a cross-sectional view of a stage in a conventional method of fabricating a pixel unit of an organic light emitting diode, taken along a line A-A' of FIG. 1.

Korean Patent Application No. 2005-0090738, filed on Sep. 28, 2005, in the Korean Intellectual Property Office, and entitled: "Organic Light Emitting Diode and Method for Fabricating the Same," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 3:
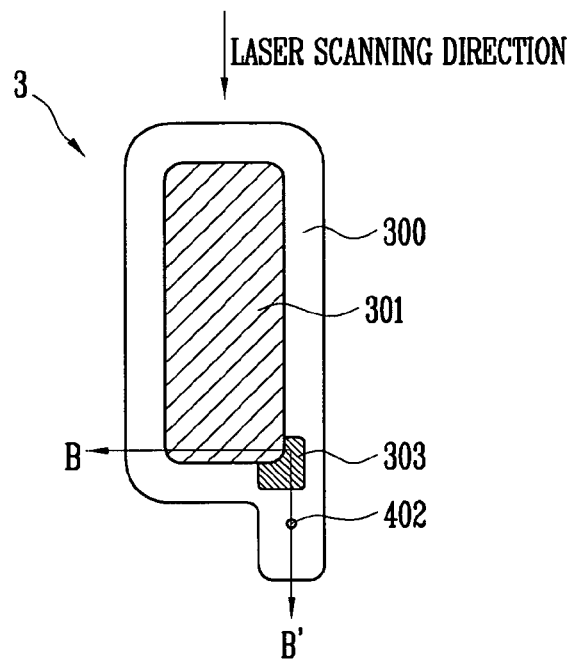
FIG. 3 illustrates a plan view of a stage in a method of fabricating a pixel unit of an organic light emitting diode according to a first embodiment of the present invention.
Figure 4:
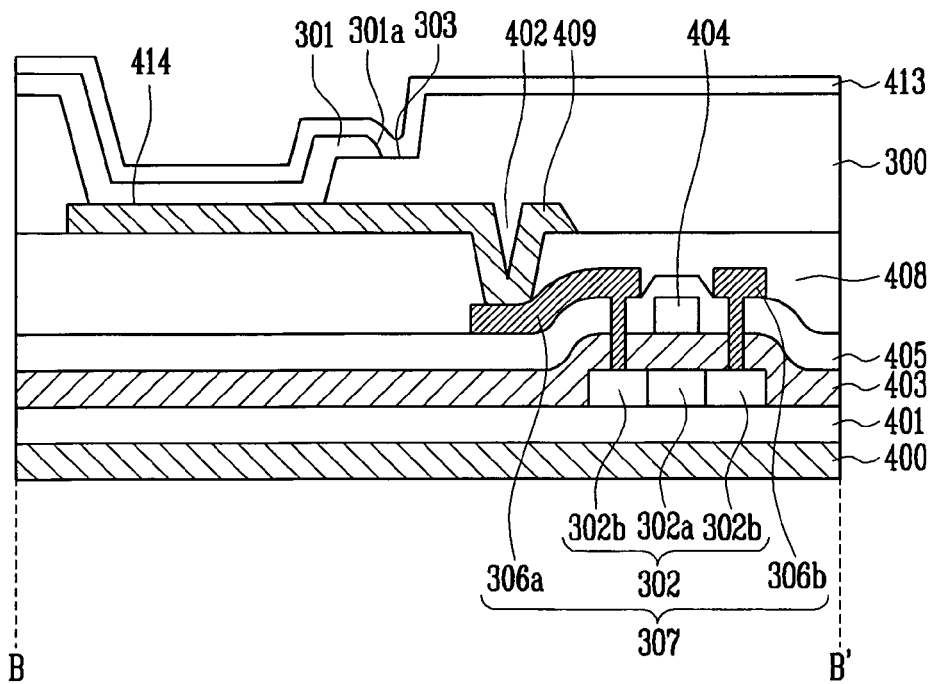
FIG. 4 illustrates a partial cross-sectional view taken along a line B-B' of FIG. 3.

FIG. 3 illustrates a plan view of a stage in a method of fabricating a pixel unit of an organic light emitting diode according to a first embodiment of the present invention, and FIG. 4 illustrates a partial cross-sectional view taken along a line B-B' of FIG. 3. Referring to FIGS. 3 and 4, one or more organic light emitting diodes may be disposed on a substrate 400. The organic light emitting diode may include a thin-film transistor 307 disposed on the substrate 400.

An organic light emitting diode and the method of fabricating the same according to embodiments of the present invention may be configured so as to enable the escape of gases from between an applied organic layer and underlying layers, which may be, e.g., a pixel-defining layer and/or an electrode layer, thereby reducing or eliminating the entrapment of gases between the organic layer and the underlying layer. A stepped portion may be provided in a pixel-defining layer adjacent to an opening for placement of the organic layer, so that transfer of the organic layer into the opening, e.g., by laser-induced thermal transfer, is facilitated. Accordingly, an organic light emitting diode according to the present invention may provide improved adhesive strength between the organic layer and the underlying layer.

For example, a buffer layer 401 may be disposed on the substrate 400, and a semiconductor layer 302 including an active channel layer 302a and ohmic contact layers 302b may be disposed on the buffer layer 401. A lightly doped drain (LDD) region (not shown) may be disposed between the active channel layer 302a and ohmic contact layers 302b. A gate insulating layer 403 and a gate electrode 404 may be sequentially disposed and patterned on the semiconductor layer. An interlayer dielectric layer 405 may be disposed on the gate electrode 404. Electrode contacts 306a and 306b, e.g., source and drain electrode contacts, may be formed on the interlayer dielectric layer 405 and may penetrate the interlayer dielectric layer 405 to make contact with the ohmic contact layers 302a and 302b of the semiconductor layer 302.

A planarization layer 408 may be disposed on a thin-film transistor 307. An electrode layer 409 may be formed on a region of the planarization layer 408 and may penetrate the planarization layer 408 through a via hole 402, so as to connect with at least one of the electrode contacts 306a and 306b of the thin-film transistor 307. The electrode layer 409 may be electrically connected to an electroluminescent element.

For example, the electrode layer 409 may be connected to an organic layer 301, e.g., a light emitting region. The organic layer 301 may be formed in an opening 414 of a pixel-defining layer 300 using, e.g., laser-induced thermal transfer. The pixel-defining layer 300 may be formed on the electrode layer 409 and on the planarization layer 408, and may include a stepped portion 303 disposed at a periphery of the opening 414.

Referring to FIG. 3, the stepped portion 303 may partially underlie the organic layer 301 and may be partially exposed by the organic layer 301. That is, an edge 301a of the organic layer 301 may be disposed on the stepped portion 303 so that the stepped portion is partially covered by the organic layer 301.

The organic layer 301 may be transferred into the opening 414 and onto the stepped portion 303 of the pixel-defining layer 300. Where the organic light emitting diode is an organic light-emitting diode, the organic layer 301 may form, e.g., an emission layer, a hole injection layer, a hole transport layer, a hole blocking layer, an electron transport layer, an electron injection layer, etc.

The stepped portion 303 may be positioned relative to the opening 414 in accordance with a direction of scanning of a laser during laser-induced thermal transfer, so as to be positioned near the portion of the opening 414 that corresponds to the last portion of the organic layer 301 scanned by the laser. According to the first embodiment of the present invention, referring to FIG. 3, where the laser scanning direction is in a longitudinal direction of the organic layer 301, i.e., from top to bottom in FIG. 3, the stepped portion 303 may be formed in a corner of the opening 414, e.g., the lower right corner in FIG. 3.

The stepped portion 303 in the pixel-defining layer 300 adjacent to the opening 414 may effectively discharge gases entrapped between the transferred organic layer 301 and the pixel-defining layer 300 and/or the electrode layer 409. The stepped portion 303 may be formed in a corner of the pixel-defining layer 300, e.g., the right corner in FIG. 3, corresponding to the last portion of the organic layer 301 transferred by the scanning of the laser across the thermal transfer donor substrate.

The stepped portion 303 may be formed by any of a number of suitable processes including, e.g., dry etching, wet etching, etc. Referring to FIG. 4, the pixel-defining layer 300 may have a thickness in a range of about 50 Å to about 10,000 Å, and the stepped portion 303 may have a thickness corresponding to about ¼ to ⅓ of the thickness of the pixel-defining layer 300. Referring to FIG. 3, the stepped portion 303 may have a width corresponding to about ¼ to about ½ of the width of the pixel region. The relative width of the stepped portion 303 may be adjusted to enhance the gas-discharging effect in accordance with a kind of a thermal transfer donor film and/or a thickness of the organic layer to be transferred from the thermal transfer donor film. A second electrode layer 413 may be formed on the organic layer 301 and pixel defining layer 300.

Second, third and fourth embodiments of the present invention will now be described with reference to FIGS. 5-9. Various features in FIGS. 5-9 may be substantially similar to those described above with respect to FIGS. 3 and 4. Therefore, in order to avoid repetition, details of similar features may be omitted from the following description of FIGS. 5-9.

Figure 5:
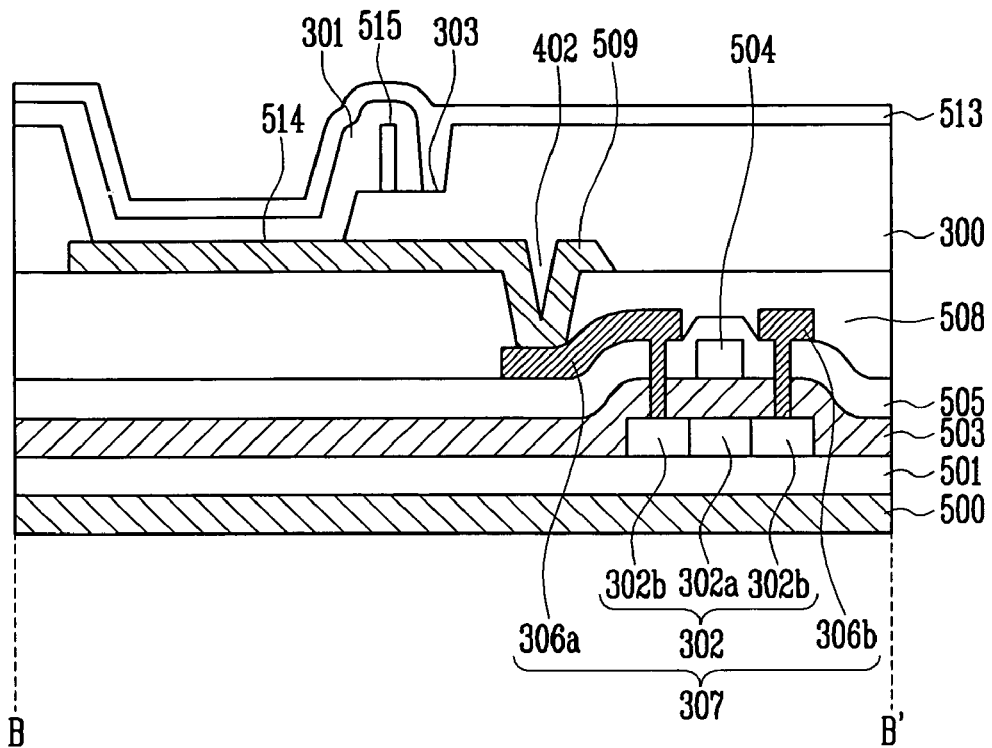
FIG. 5 illustrates a partial cross-sectional view taken along a line B-B' of FIG. 3 according to a second embodiment of the present invention.

FIG. 5 illustrates a partial cross-sectional view taken along a line B-B' of FIG. 3 according to a second embodiment of the present invention. Referring to FIG. 5, an organic light emitting diode according to the second embodiment of the present invention may include at least one thin-film transistor 307 formed on a substrate 500, a planarization layer 508 formed on the thin-film transistor 307 and an electrode layer 509 disposed on a portion of the planarization layer 508 and connected to at least one of electrode contacts 306a and 306b.

An opening 514 in the pixel-defining layer 300 may overlie a portion of the electrode layer 509, such that the electrode layer 509 is at least partially exposed. A stepped portion 303 may be disposed adjacent to the opening 514 for easily discharging gases during transfer of an organic layer 301. The stepped portion 303 may be formed at a corner of the pixel-defining layer 300 corresponding to a last portion of the organic layer 301 that is transferred.

As illustrated in FIG. 5, a protrusion 515 may project from the stepped portion 303, extending away from the substrate 500, such that the protrusion 515 has a greater height than the stepped portion 303. The protrusion 515 may be formed at least at a higher height than that of the stepped portion 303, and may be formed at the same height as the pixel-defining layer 300. The organic layer 301 may be formed in the opening 514, on the stepped portion 303 and on the protrusion 515. Gases that would otherwise be trapped between the organic layer 301 and the pixel-defining layer 300 and/or electrode layer 509 may be easily discharged due to the step height formed by the protrusion 515. A second electrode layer 513 may be formed on the organic layer 301 and pixel definding layer 300.

Figure 6:
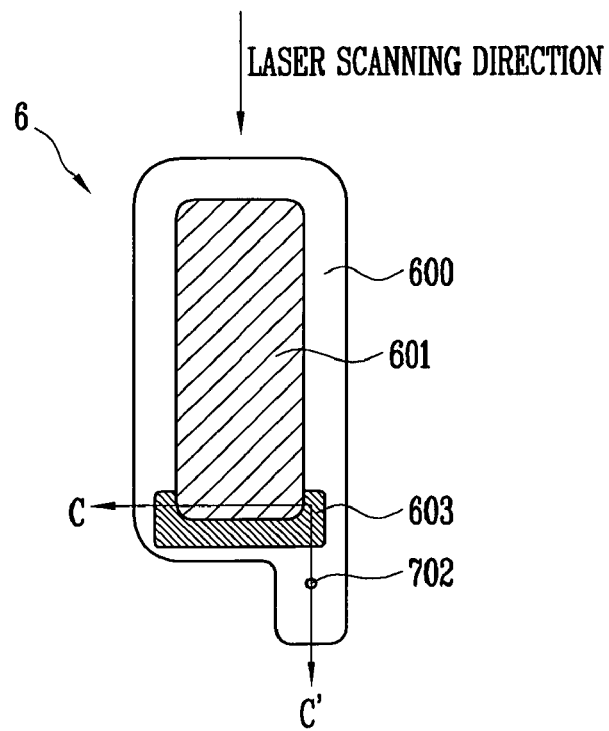
FIG. 6 illustrates a plan view of a stage in a method of fabricating a pixel unit of an organic light emitting diode according to a third embodiment of the present invention.
Figure 7:
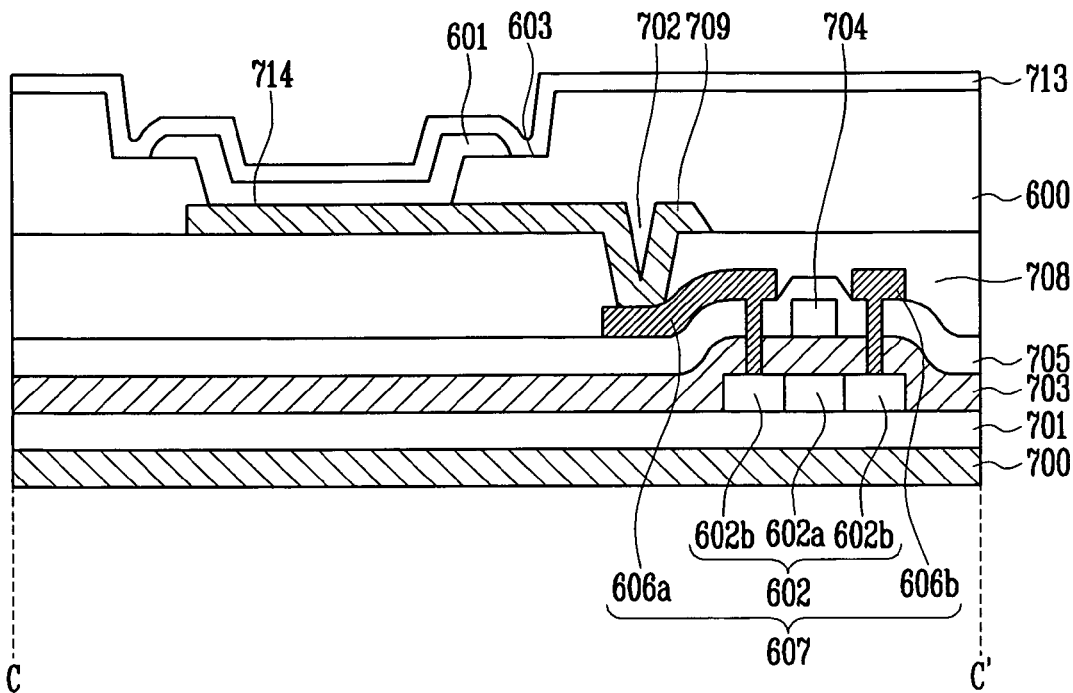
FIG. 7 illustrates a cross-sectional view taken along a line C-C' of FIG. 6.

FIG. 6 illustrates a plan view of a stage in a method of fabricating a pixel unit of an organic light emitting diode according to a third embodiment of the present invention, and FIG. 7 illustrates a cross-sectional view taken along a line C-C' of FIG. 6. Referring to FIGS. 6 and 7, an organic layer 601, e.g., a light emitting region, may be formed in an opening 714 of a pixel-defining layer 600 using, e.g., laser-induced thermal transfer. The pixel-defining layer 600 may be formed on an electrode layer 709 and on a planarization layer 708, and may include a stepped portion 603 disposed at a periphery of the opening 714.

Referring to FIG. 6, the stepped portion 603 may partially underlie the organic layer 601 and may be partially exposed by the organic layer 601. The stepped portion 603 may be formed across an entire edge portion of the pixel-defining layer 600, e.g., the lower portion in FIG. 6, and may be positioned relative to the opening 714 in accordance with a direction of material transfer. Where the material transfer includes scanning of a laser, the stepped portion may be positioned near the portion of the opening 714 that corresponds to the last portion of the organic layer 601 that is scanned by the laser during thermal transfer of the organic layer 601.

Referring to FIG. 7, the organic light emitting diode according to the third embodiment of the present invention may include at least one thin-film transistor 607 formed on a substrate 700 and a planarization layer 708 formed on the thin film transistor 607. An electrode layer 709 may be connected with one of first and second electrode contacts 606a, 606b, which may be, e.g., source and drain electrode contacts. The electrode layer 709 may be disposed on the planarization layer 708 and may penetrate the planarization layer 708 through a via 702 to contact the electrode. An opening 714 in the pixel-defining layer 600 may partially expose the electrode layer 709. A stepped portion 603 may be formed along an entire lower edge of the opening 714. The stepped portion 603 may be positioned with respect to the opening 714 so as to correspond to the last portion of the organic layer 601 that is transferred. The organic layer 601 may formed in the opening 714 and on the stepped portion 603. The organic layer 601 may partially cover the stepped portion 603. A second electrode layer 713 may be formed on the organic layer 601 and pixel definding layer 600.

Figure 8:
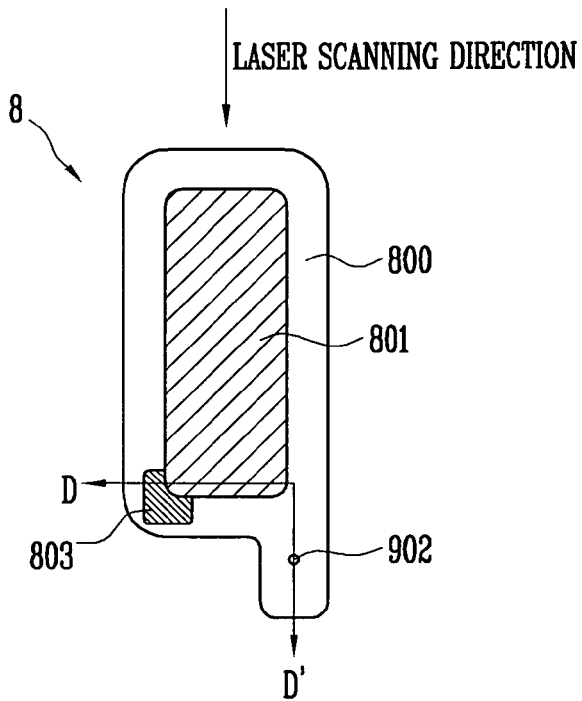
FIG. 8 illustrates a plan view of a stage in a method of fabricating a pixel unit of an organic light emitting diode according to a fourth embodiment of the present invention.
Figure 9:
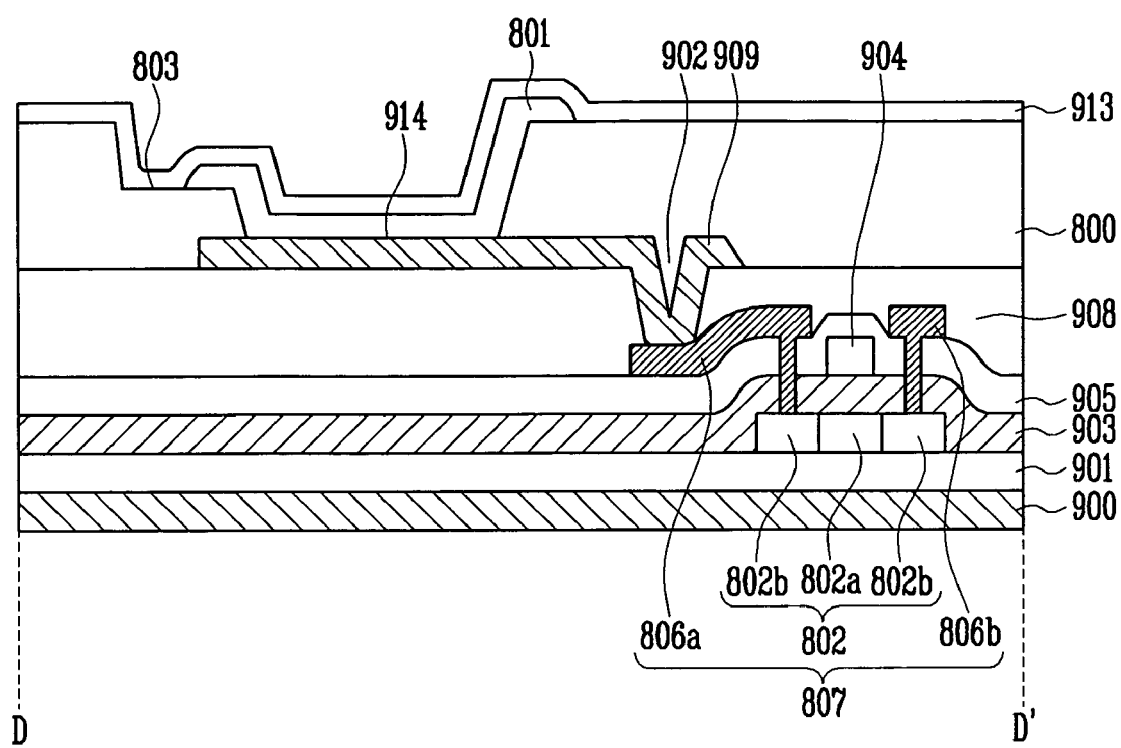
FIG. 9 illustrates a cross-sectional view taken along a line D-D' of FIG. 8.

FIG. 8 illustrates a plan view of a stage in a method of fabricating a pixel unit of an organic light emitting diode according to a fourth embodiment of the present invention, and FIG. 9 illustrates a cross-sectional view taken along a line D-D' of FIG. 8. Referring to FIG. 8, an organic layer 801, e.g., a light emitting region, may be formed in an opening 914 of a pixel-defining layer 800 using, e.g., laser-induced thermal transfer. A stepped portion 803 may be formed in a corner, e.g., a left corner, of the pixel-defining layer 800.

The stepped portion 803 may be positioned with respect to the opening 914 so as to correspond to the last portion of the organic layer 801 that is transferred during laser-induced thermal transfer. Where a thin-film transistor 807 is also formed near the end of the opening 914 that corresponds to the last portion of the organic layer 801 to be transferred, then the stepped portion 803 may be formed in a corner opposite the thin-film transistor 807, e.g., in the bottom left corner as illustrated in FIG. 8.

Referring to FIG. 9, an organic light emitting diode according to the fourth embodiment of the present invention may include at least one thin-film transistor 807 formed on a substrate 900, and a planarization layer 908 may be formed on the thin-film transistor 807. An electrode layer 909 may be connected with one of first and second electrode contacts 806a and 806b, which may be, e.g., source and drain electrode contacts. The electrode layer 909 may be formed on the planarization layer 908 and may penetrate the planarization layer through a via 902. An opening 914 may be formed in the pixel-defining layer 800 and may partially expose the electrode layer 909. The stepped portion 803 may be formed in, e.g., a left corner of the pixel-defining layer 800, and may be positioned with respect to the opening 914 so as to correspond to the last portion of the organic layer 801 that is transferred. The organic layer 801 may be formed in the opening 914 and on the stepped portion 803. The organic layer may partially cover the stepped portion 803. A second electrode layer 813 may be formed on the organic layer 801 and pixel definding layer 800.

Exemplary embodiments of the present invention have been disclosed herein, and although specific terms are employed, they are used and are to be interpreted in a generic and descriptive sense only and not for purpose of limitation. For example, in addition to the locations of the stepped portion described in the embodiments above, the stepped portion may be formed at other locations where the gases may be discharged, and two, or more, protrusions may also be formed on the stepped portion. Further, it will be understood that one or more layers may be laminated when the organic layer is transferred. Moreover, while aspects of the present invention have been explained using an organic light emitting diode as an exemplaryorganic light emitting diode, embodiments of the present invention are not limited to devices of this nature and may also be applied to, e.g., passive devices. Accordingly, it will be understood by those of ordinary skill in the art that various changes in form and details may be made without departing from the spirit and scope of the present invention as set forth in the following claims.

What is claimed is:

1. An organic light emitting diode, comprising:
   a pixel-defining layer disposed on a substrate, the pixel-defining layer having an opening therein and having at least one stepped portion formed adjacent to the opening; and
   an organic layer disposed in the opening and partially covering a ledge of the at least one stepped portion.

2. The organic light emitting diode as claimed in claim 1, wherein the ledge of the at least one stepped portion directly adjoins the opening.

3. The organic light emitting diode as claimed in claim 1, wherein the at least one stepped portion is positioned at a corner of the opening.

4. The organic light emitting diode as claimed in claim 1, wherein the at least one stepped portion spans a side of the opening.

5. The organic light emitting diode as claimed in claim 1, wherein the at least one stepped portion is about 1/4 to about 1/3 as thick as the pixel-defining layer.

6. The organic light emitting diode as claimed in claim 5, wherein the pixel-defining layer has a thickness in a range of from about 50 Å to about 10,000 Å.

7. The organic light emitting diode as claimed in claim 1, wherein the at least one stepped portion is about 1/4 to about 1/2 as wide as a pixel region.

8. The organic light emitting diode as claimed in claim 1, further comprising at least one protrusion that projects from the ledge of the at least one stepped portion and extends away from the substrate, wherein the organic layer covers the at least one protrusion.

9. The organic light emitting diode as claimed in claim 8, wherein the at least one protrusion extends to a same height as the pixel-defining layer.

10. The organic light emitting diode as claimed in claim 1, wherein an electrode layer is disposed on the substrate between the substrate and the pixel-defining layer,
the electrode layer is at least partially exposed through the opening, and
the organic layer at least partially covers the part of the electrode layer that is exposed through the opening.

11. The organic light emitting diode as claimed in claim 1, wherein the organic layer forms at least one of an emission layer, a hole injection layer, a hole transport layer, a hole blocking layer, an electron transport layer, and an electron injection layer.

12. A method of fabricating an organic light emitting diode, comprising:
forming a pixel-defining layer on a substrate, the pixel-defining layer having an opening and at least one stepped portion; and
transferring an organic layer onto the substrate so that the organic layer is disposed in the opening and partially covering a ledge of the at least one stepped portion.

13. The method as claimed in claim 12, wherein the at least one stepped portion is positioned relative to the opening so as to correspond to a last portion of the organic layer to be transferred onto the substrate.

14. The method as claimed in claim 13, wherein the transfer of the organic layer begins at a first side of the opening and ends at a second side of the opening opposite the first side.

15. The method as claimed in claim 14, wherein the opening is oblong, and the first and second sides are narrow portions of the oblong opening.

16. The method as claimed in claim 13, wherein the transferring includes a laser-induced thermal transfer, and the direction of laser scanning is such that laser scanning ends near the at least one stepped portion.

17. An organic light emitting diode, comprising:
a base layer;
an intermediate layer on the base layer, the intermediate layer having an opening therein to expose a portion of the base layer; and
an organic layer, the organic disposed in the opening so as to cover the exposed portion of the base layer and disposed on the intermediate layer,
wherein the intermediate layer includes a recessed portion adjacent to the opening, and the organic layer partially covers a ledge of the recessed portion and partially exposes the ledge of the recessed portion.

18. The organic light emitting diode as claimed in claim 17, wherein the recessed portion extends from a first edge of the opening laterally beyond the organic layer.

19. The organic light emitting diode as claimed in claim 18, wherein the recessed portion has a first height where it meets the first edge of the opening, the opening has a second edge having a second height, and the first height is less than the second height.

20. The organic light emitting diode as claimed in claim 17, wherein the organic layer has at least three sides and the recessed portion extends beyond at least two of the sides of the organic layer.

* * * * *